United States Patent [19]

Uchida et al.

[11] Patent Number: 4,728,615
[45] Date of Patent: Mar. 1, 1988

[54] METHOD FOR PRODUCING THIN-FILM PHOTOELECTRIC TRANSDUCER

[75] Inventors: Yoshiyuki Uchida; Masaharu Nishiura; Toshio Hama, all of Yokosuka, Japan

[73] Assignees: Fuji Electric Company Ltd.; Fuji Electric Corporate Research and Development Ltd., both of Japan

[21] Appl. No.: 776,670

[22] Filed: Sep. 16, 1985

[30] Foreign Application Priority Data

Oct. 17, 1984 [JP] Japan ............................... 59-217571

[51] Int. Cl.⁴ ...................... H01L 31/18; H01L 27/14
[52] U.S. Cl. ......................................... 437/2; 136/244;
 136/258; 136/290; 437/8; 437/51; 437/205
[58] Field of Search ................... 29/572, 574; 136/290,
 136/244, 258 AM; 324/158 D; 156/627;
 427/74, 86, 39; 437/2, 4, 8, 51, 205

[56] References Cited
U.S. PATENT DOCUMENTS 4,640,002 2/1987 Phillips et al. ..................... 29/574

FOREIGN PATENT DOCUMENTS 59-86269  5/1984 Japan ................................. 136/261
59-94884  5/1984 Japan ................................. 136/261
59-107579 6/1984 Japan ................................. 136/290

OTHER PUBLICATIONS

Y. Hamakawa, *Proceedings, 5th E.C. Photovoltaic Solar Energy Conf.* (1983), Reidel Pub. Co. (1984), pp. 690–697.
A. H. Firester, *Proc. SPIE*, vol. 407, pp. 37–41 (1983).
P. G. Lasswell et al, *Conf. Record, 15th IEEE Photovoltaic Specialists Conf.* (1981), pp. 1021–1024.

*Primary Examiner*—Aaron Weisstuch
*Attorney, Agent, or Firm*—Stevens, Davis, Miller & Mosher

[57] ABSTRACT

An apparatus and method for producing a thin-film photoelectric transducer. The transducer has a transparent substrate, an amorphous silicon layer and a metal layer; the apparatus has a processing laser for patterning each of the layers. In addition, a separate visible laser is used to detect defects in the layers and the processor laser is then used to correct the defects.

7 Claims, 4 Drawing Figures

METHOD FOR PRODUCING THIN-FILM PHOTOELECTRIC TRANSDUCER

RELATED APPLICATIONS

Related applications, filed are Ser. Nos. 06/771,623 filed Sept. 3, 1985, 06/788,565 filed Oct. 17, 1985 and 06/780,093 filed Sept. 25, 1985.

BACKGROUND OF THE INVENTION

The present invention relates to an apparatus for producing a thin-film photoelectric transducer comprising an integrated assembly of unit cells, each made of thin semiconductor films, such as amorphous silicon (hereinafter a-Si) layers.

Photoelectric transducers using a-Si have attracted the increasing attention of researchers, since a-Si layers having desired shapes and covering large areas can be easily produced by plasma-assisted CVD techniques. In order to generate large voltages and currents, the transducers usually consist of an integrated assembly of unit cells, typically as shown in FIG. 2. In FIG. 2, a unit photoelectric cell 20 is formed by successively depositing a transparent electrode film 22, an a-Si photoactive layer 23 and a metal electrode layer 24 on a glass substrate 21, and a plurality of such unit cells are connected in series. In order to provide the illustrated pattern on a single glass substrate 21, the respective layers 22, 23 and 24 are first deposited on the entire surface of the substrate and are subsequently subjected to chemical etching procedures. Instead of chemical etching processes, U.S. Pat. No. 4,292,092 proposes a laser scribing technique that enables high-speed patterning with a narrow laser beam. As the area of the substrate increases, not only does it become difficult to ensure uniform and precise patterning by the chemical etching techniques, but also larger-scale equipment which requires complicated operating procedures becomes necessary. On the other hand, the laser scribing technique provides a higher accuracy in patterning and is highly adaptable to automation.

A further problem associated with the formation of an a-Si layer 23 on a large substrate 21 is in the increased probability of the creation of defects, such as pinholes, in the a-Si layer. The presence of many pinholes will cause shorting of top and bottom electrodes 22 and 24, thereby decreasing the yield of acceptable devices. It is, therefore, necessary to ensure high product yields by detecting and eliminating any defects in the a-Si layer. While microscopic observations are commonly used for detection purposes, other methods are also known, such as by scanning the surface of the a-Si layer to determine its photocurrent distribution, or by causing an electric current to flow through the a-Si layers to measure the amount of heat generated at shorted points. Any detected defects may be burnt out with a laser beam or by application of a reverse bias voltage. As the use of substrates with larger areas increases, it becomes even more important to provide efficient methods for patterning the individual layers that constitute the photoelectric transducer, detecting any defects in the a-Si layer, and eliminating defects if there are any.

SUMMARY OF THE INVENTION

The principal object, therefore, of the present invention is to provide an apparatus for fabricating a thin-film photoelectric transducer of the integrated unit cell type that requires simple steps for efficient patterning of the constituent layers, detection of any defects in the thin semiconductor film and eliminating defects, if any.

This object of the present invention can be achieved by an apparatus for fabricating a thin-film photoelectric transducer cell that comprises a support table capable of freely moving in two directions, intersecting at right angles, a processing laser and a separate visible laser capable of directing a laser beam against a device substrate on said support table, and a unit for connection to the transducer electrodes for measuring the photoelectric characteristics of the transducer.

The processing laser is used for the purposes of patterning and eliminating any defects found in the a-Si layer, and a variety of lasers may be used, such as a Q-switched neodymium-YAG laser, and neodymium-YAG lser radiating the second harmonic, a neodymium-YAG glass laser, a ruby laser, $CO_2$ laser, an argon laser and a dye laser. A suitable laser should be selected, depending upon the materials of the constituent layers and on the particular use of the transducer. The visible laser is used to detect any defects in unit cells by verifying the performance of the transducer within the visible range of the light spectrum in which it is designed to be operated. Lasers producing lower outputs (not more than several tens of milliwatts) than the processing lasers should be selected from among such layers as a He-Ne laser, He-Cd laser, dye laser, Ar laser, and Kr laser. The foregoing objectives will be accomplished by the invention, as shown in the accompanying drawings, which show the invention by way of example and not of limitation.

DETAILED DESCRIPTION OF THE INVENTION

Figure 1:
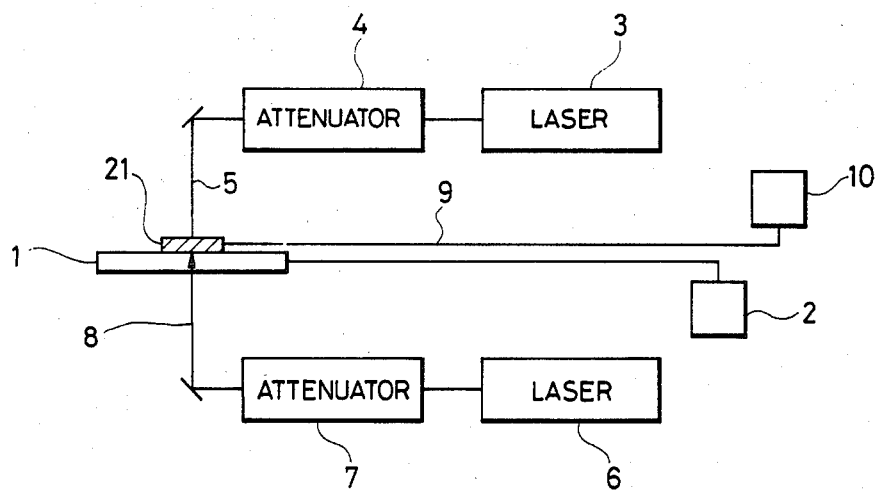
FIG. 1 is a block diagram for the apparatus in accordance with one embodiment of the present invention.

Referring now to the drawings in greater detail, FIG. 1 shows a cleaned glass substrate 21 measuring $10 \times 10$ cm or $30 \times 40$ cm, upon which is formed a transparent conductive film 22, either by electron beam evaporation or by thermal CVD techniques. The transparent conductive film 22 is made of indium tin oxide (ITO), $SnO_2$, or a dual layer of $ITO/SnO_2$. Then, the substrate 21 is placed on a transparent X-Y movable table 1, in an apparatus of the type shown in FIG. 1 incorporating the concept of the present invention. The X-Y movable table 1 is driven by a linear motor (not shown) and is automatically controlled by a microcomputer 2, as is known in the art. A neodymium-YAG laser 3, excited in a Q-switched mode at an average power of 12 watts in a TEM mode with a pulse rate of 30 kilohertz and a pulse width of 300 nanoseconds, is positioned above the transparent conductive film (not shown in FIG. 1, see FIG. 2) on the substrate 21. An output from the laser 3 passes through an attenuator 4, from which a laser beam 5, having its power controlled to be within the range of 4–8 watts, is directed against the conductive film 22 (see FIG. 2) to provide a desired pattern by the programmed movement of the X-Y movable table 1.

Figure 2:
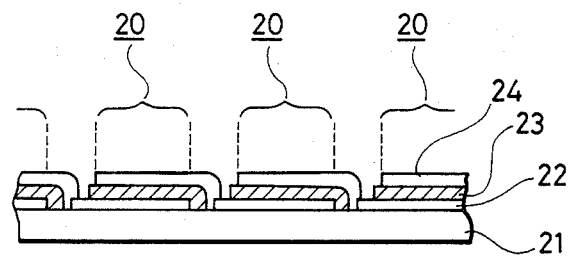
FIG. 2 is a cross-section showing the construction of an a-Si solar cell composed of a plurality of unit cells integrated on a glass substrate.

Subsequently, an A-Si layer is deposited on the transparent conductive film 22 by glow discharge plasma-assisted decomposition techniques, and the deposited layer is scribed with 1-4 watts of power from the Nd:YAG laser 3 so as to provide a patterned a-Si photoactive layer 23, as shown in FIG. 2. Thereafter, a silver or aluminum layer is formed on the entire surface of the active layer 23 by electron beam evaporation or sputtering techniques, and the layer so formed is scribed with 1-3 watts of power from the Nd:YAG laser 3 so as to provide a patterned metal electrode 24.

The surface or structural integrity of the thus formed unit photoelectric cells 20 may be checked by the following procedures. While the X-Y movable table 1 is caused to move in coarse pitches, a reverse bias of, say, 2-8 millivolts, is applied to the individual unit cells for measuring the amount of any leakage current from the cells in the dark. Any unit cells 20 that produce leakage currents exceeding a predetermined value between 0.2 and 0.5 microamperes are marked as being defective. The entire surface of each defective unit cell is scanned by a He-Ne laser 6, while the X-Y movable table 1 is caused to move at steps of 50-500 μm, while the movable table 1 is moved above it. The output of the laser 6 is passed through an attenuator 7, from which a laser beam 8, having a power of 10 mW and a spot diameter of 30 μm, is issued to impinge on the individual unit cells through the X-Y movable table 1 and the glass substrate 21.

The distribution of photocurrent generated by illumination with the laser beam is measured with a photoelectric characteristics detector 10 connected to the cells by a lead wire 9. Any portions of the device that have caused a drop in current are enlarged by differential and, if any shorted area is located, it is immediately burnt out by focussed processor laser beam 5, with an average power of 1-5 watts and a spot diameter of 10-50 μm. Either one of the two lasers 3 and 6 that is not used at a particular time should be equipped with a shutter so that it will not interfere with the measurement or illumination by the other laser.

The surface or structural integrity of the unit photoelectric cells may be checked by other methods, such as by examining the open-circuit voltage, fill factor, or shunt resistance measured when the transducer is illuminated with the visible laser light.

Figure 3:
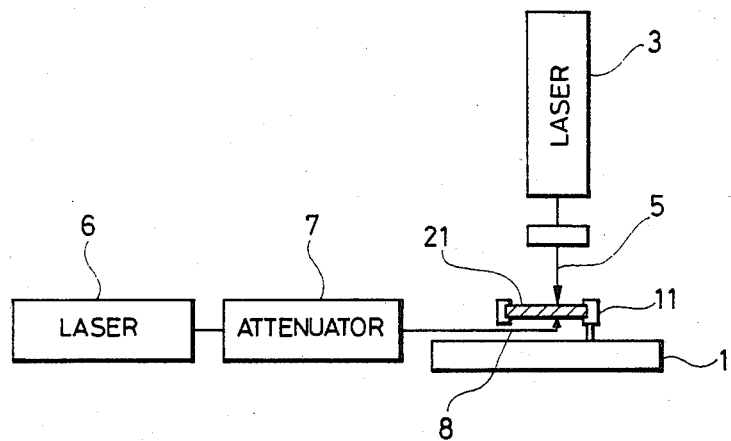
FIG. 3 is a block diagram showing a first alternative embodiment with a spacing jig.

In the embodiment discussed above, the light 8 from the visible laser 6 is directed to pass through the X-Y movable table 1. In an alternative embodiment, as shown in FIG. 3, a jig 11 may be used to keep the substrate 21 a predetermined distance above the movable table 1 so that the light 8 from the visible laser 6 may directly impinge on the glass substrate 21.

Figure 4:
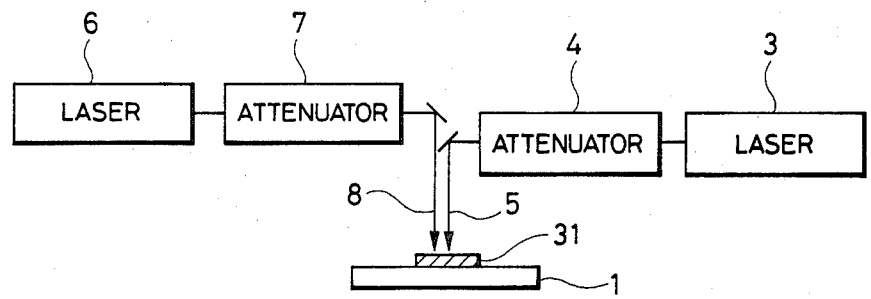
FIG. 4 is a second alternative embodiment in which the processing laser and the detection laser are on the same side of the substrate.

A further embodiment of the present invention is shown in FIG. 4, wherein both the light 5 from the processing laser 3 and the light 8 from the visible laser 6 are directed from the same side. In this embodiment, the unit cells are so positioned that the glass substrate 21 faces down during patterning operations, and then the glass is turned over so as to face up, both during automatic scanning of any defective parts and during the subsequent elimination of defects, if any, by illumination with the light from the processing laser.

As described above, the apparatus of the present invention is equipped with processing laser that performs the patterning of the individual layers that constitute a photoelectric transducer and the elimination of any defects in a thin semiconductor film on the transducer, as well as a visible laser used to detect any defects in the thin semiconductor film. A device substrate carried on a support table capable of moving in two directions, intersecting at right angles, is illuminated with light from the two lasers so as to successively perform the patterning, defect detection, and defect elimination operations. Since the functions for performing the individual steps of transducer fabrication are integrated in the apparatus of the present invention, its cost is reduced, while ensuring maximum efficiency for the fabrication steps. Another commercial advantage results from the fact that the apparatus of the invention can be used not only in the manufacture of thin-film photoelectric transducers of the integrated unit cell-type formed on transparent insulating substrates, but also those using opaque insulating substrates or metal conductive substrates.

We claim:

1. A method for manufacturing thinfilm photoelectric transducers, comprising:
   positioning a piece of transparent substrate material on a support table mounted for movement in two directions, which are substantially at right angles;
   forming a transparent conductive film on a surface of said substrate;
   operating a Nd:YAG laser along the outer surface of said film to pattern it;
   subsequently depositing an a-Si layer on said film and scribing said layer with the Nd:YAG laser;
   forming a metal layer on the outer surface of the a-Si layer and scribing the metal layer with the Nd:YAG laser;
   applying a reverse bias to the then-formed transducer and measuring the leakage current to detect any defective transducer;
   moving the table and scanning the surface of any defective transducer through the transparent substrate with a visible light laser to locate each defect; and
   operating the Nd:YAG laser over each defect to eliminate that defect.

2. The method of claim 1, in which the conductive film is formed by electron beam evaporation or thermal CVD deposition.

3. The method of claim 1, in which the conductive film is selected from the group consisting of indium tin oxide (ITO), $SnO_2$, and a dual layer of $ITO/SnO_2$.

4. The method of claim 1, in which the a-Si layer is deposited by a glow discharge plasma-assisted decomposition.

5. The method of claim 1, in which the metal layer is silver or aluminum and is deposited by evaporation or sputtering.

6. The method of claim 1, in which the scanning is accomplished by movement of the table in coarse pitches in relation to the visible light laser while the reverse bias is applied.

7. The method of claim 1 including operating said Nd:YAG laser at an average power of 4-8 watts when used for patterning and at a power of 1-4 watts when used for scribing.

* * * * *